US009917589B2

(12) United States Patent
Koo et al.

(10) Patent No.: US 9,917,589 B2
(45) Date of Patent: Mar. 13, 2018

(54) TRANSMITTER CIRCUIT AND RECEIVER CIRCUIT FOR OPERATING UNDER LOW VOLTAGE

(71) Applicant: Samsung Electronics Co., Ltd., Suwon-si, Gyeonggi-do (KR)

(72) Inventors: Kyunghoi Koo, Suwon-si (KR); Sanghune Park, Seongnam-si (KR); Jin-Ho Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/392,554

(22) Filed: Dec. 28, 2016

(65) Prior Publication Data

US 2017/0222649 A1    Aug. 3, 2017

(30) Foreign Application Priority Data

Feb. 2, 2016  (KR) .................. 10-2016-0012766
May 20, 2016  (KR) .................. 10-2016-0062282

(51) Int. Cl.
*H03K 19/00* (2006.01)
*H03K 19/17* (2006.01)
(Continued)

(52) U.S. Cl.
CPC ....... *H03K 19/018521* (2013.01); *G11C 7/10* (2013.01); *H03K 19/0013* (2013.01);
(Continued)

(58) Field of Classification Search
CPC . G11C 7/1057; G11C 7/1084; G11C 11/4093; G11C 29/022; H03K 19/018521; H03K 19/017509; H03K 19/00361; H03K 19/00384; H03K 17/6872; H03K 19/0013; H03K 19/018592; H03K 17/145;
(Continued)

(56) References Cited

U.S. PATENT DOCUMENTS 6,459,325 B1 * 10/2002 Hall .................. H03K 4/00
                                                326/27
7,161,378 B2 * 1/2007 Kang .............. H04L 25/0284
                                                326/26
(Continued)

FOREIGN PATENT DOCUMENTS

KR  10-2008-0100055 A  11/2008
KR  10-2008-0100948 A  11/2008

*Primary Examiner* — Vibol Tan
(74) *Attorney, Agent, or Firm* — Harness, Dickey & Pierce, P.L.C.

(57) ABSTRACT

A transmitter circuit including a pre-driver circuit configured to receive a logic signal from a logic circuit and to generate a first signal driven by a first voltage, the pre-driver circuit including a transistor having a threshold voltage equal to or lower than a threshold voltage of a transistor included in the logic circuit, and a main-driver circuit configured to receive the first signal and generate a second signal driven by a second voltage, the main-driver circuit configured to output the second signal to an input/output pad, the main-driver circuit including a transistor having a threshold voltage which is equal to or lower than the threshold voltage of the transistor included in the logic circuit may be provided.

9 Claims, 11 Drawing Sheets

(51) Int. Cl.
*G11C 7/10* (2006.01)
*H03K 19/0185* (2006.01)
*H03K 19/177* (2006.01)
*H03K 19/0175* (2006.01)
*H03K 19/003* (2006.01)

(52) U.S. Cl.
CPC ............. *H03K 19/00361* (2013.01); *H03K 19/017509* (2013.01); *H03K 19/017518* (2013.01); *H03K 19/018528* (2013.01); *H03K 19/018592* (2013.01); *H03K 19/17744* (2013.01)

(58) Field of Classification Search
CPC ..... H03K 19/00315; H03K 19/018571; H03K 19/17744; H03K 17/164; H03K 2217/94094; H03K 19/018507; H03K 19/01806; G06F 13/4234; G06F 13/4086; G06F 13/4072; H04L 25/0272; H04L 25/0278; H04L 25/028
See application file for complete search history.

(56) References Cited

U.S. PATENT DOCUMENTS

| | | | |
|---|---|---|---|
| 7,193,441 B2 | 3/2007 | Chen et al. | |
| 7,593,280 B2* | 9/2009 | Kim | G11C 7/1051 365/222 |
| 7,605,618 B2 | 10/2009 | Srinivas et al. | |
| 7,746,147 B2* | 6/2010 | Kiritani | H03K 3/356113 326/63 |
| 7,786,760 B2* | 8/2010 | Wang | H03K 19/018521 326/68 |
| 7,990,175 B2* | 8/2011 | Koo | H03K 19/018521 326/26 |
| 8,058,924 B1* | 11/2011 | Ren | G11C 29/022 323/315 |
| 8,068,357 B2 | 11/2011 | Ware et al. | |
| 8,344,763 B2* | 1/2013 | Oosawa | H03K 19/018521 327/108 |
| 8,536,925 B2 | 9/2013 | Bhattacharya et al. | |
| 8,681,566 B2* | 3/2014 | Kim | G11C 7/1057 365/185.23 |
| 8,811,096 B2* | 8/2014 | Matsuoka | G11C 7/1057 365/189.11 |
| 8,837,231 B2* | 9/2014 | Oh | G11C 7/1084 365/189.05 |
| 9,054,700 B2* | 6/2015 | Kim | G11C 7/1057 |
| 9,455,713 B1* | 9/2016 | Kadkol | H03K 19/018514 |
| 2003/0080774 A1* | 5/2003 | Funaba | H03K 19/018592 326/30 |
| 2005/0212552 A1* | 9/2005 | Chung | H03K 19/018528 326/30 |
| 2008/0048736 A1 | 2/2008 | Ruy | |
| 2008/0061832 A1 | 3/2008 | Hu et al. | |
| 2010/0231267 A1* | 9/2010 | Scott | H03K 19/018507 327/108 |
| 2010/0264958 A1 | 10/2010 | Nakamura et al. | |
| 2011/0298494 A1 | 12/2011 | Bringivijayaraghavan et al. | |
| 2013/0093472 A1* | 4/2013 | Lee | H01L 27/0207 327/108 |
| 2015/0227188 A1 | 8/2015 | Ware et al. | |
| 2016/0241246 A1* | 8/2016 | Potluri | H03K 19/17744 |

* cited by examiner

TRANSMITTER CIRCUIT AND RECEIVER CIRCUIT FOR OPERATING UNDER LOW VOLTAGE

CROSS-REFERENCE TO RELATED APPLICATIONS

This application claims priority under 35 U.S.C. § 119 to Korean Patent Application No. 10-2016-0012766, filed on Feb. 2, 2016, and Korean Patent Application No. 10-2016-0062282, filed on May 20, 2016, in the Korean Intellectual Property Office, the entire contents of which are hereby incorporated by reference.

BACKGROUND

Example embodiments of the inventive concepts relate to a semiconductor device, in particular, to a transmitter circuits and receiver circuits for a low voltage operation.

Highly-integrated, high-performance, and/or low-power semiconductor integrated circuits are desired according to a recent trend of mobile devices. The low power consumption of the semiconductor integrated circuit may be implemented in various ways. For example, the low power consumption of the semiconductor integrated circuit may be designed to lower the operating voltage of the semiconductor integrated circuit. In particular, an interface circuit consumes a large proportion in the total power consumption to transmit and receive data. To reduce the power consumption, a power supply voltage of a logic circuit in a recent system-on-chip tends to decrease to, for example, 1.0 V or lower.

A dynamic voltage scaling frequency (DVFS) technology is being used as another way for reducing power consumption of the semiconductor integrated circuit. The DVFS refers to a technique for reducing the power consumption by changing an operating speed and a driving voltage of the semiconductor integrated circuit based on a workload thereof. The semiconductor integrated circuit may be capable of changing a driving voltage of a logic circuit and an interface circuit based on a DVFS operation.

Although a power supply voltage may decrease according to a low voltage trend of a mobile semiconductor device and a power supply voltage may decrease due to a change in a driving voltage according to the DVFS operation, the transmitter circuit and the receiver circuit, which operate more efficiently, are desired to further reduce power consumption of the semiconductor device.

SUMMARY

Some example embodiments of the inventive concepts provide a transmitter circuit that is implemented with low-voltage transistors and operates even at a low voltage. Some other example embodiments of the inventive concepts provide a receiver circuit that includes a plurality of dedicated buffers operating different operating voltages and efficiently operate according to a voltage change that occurs according to a dynamic voltage scaling frequency (DVFS) operation.

According to an example embodiment of the inventive concepts, a transmitter circuit may include a pre-driver circuit and a main-driver circuit. The pre-driver circuit may receive a logic signal from a logic circuit to generate a first signal driven by a first voltage. The main-driver circuit may receive the first signal to generate a second signal driven by a second voltage to output the second signal to the input/output pad. Each of the pre-driver circuit and the main-driver circuit may include a transistor having a threshold voltage which is equal to or lower than a threshold voltage of a transistor included in the logic circuit.

According to an example embodiment of the inventive concepts, an interface circuit may include a first input buffer configured to be driven by a first voltage to receive input data of a low-frequency band from an input/output pad, and a second input buffer configured to be driven by a second voltage to receive input data of a high-frequency band from the input/output pad.

According to an example embodiment of the inventive concepts, an interface circuit may include a transmitter and a receiver. The transmitter may include a pre-driver circuit and a main-driver circuit. The pre-driver circuit may be configured to receive a logic signal from a logic circuit and to generate a first signal driven by a first voltage, and may include a transistor having a threshold voltage equal to or lower than a threshold voltage of a transistor included in the logic circuit. The a main-driver circuit may be configured to receive the first signal and generate a second signal driven by a second voltage to output the second signal to an input/output pad, and may include a transistor having a threshold voltage which is equal to or lower than the threshold voltage of the transistor included in the logic circuit. The receiver may include a first input buffer and a second input buffer. The first input buffer may be configured to be driven by the first voltage to receive input data of a low-frequency band from the input/output pad. The second input buffer may be configured to be driven by a third voltage to receive input data of a high-frequency band from the input/output pad.

DETAILED DESCRIPTION

Below, some example embodiments of inventive concepts will now be described more fully so that those skilled in the art can easily comprehend the inventive concepts. Furthermore, a term "high voltage" means a relatively high voltage among power supply voltages of different levels to drive a system-on-chip (SoC), and a term "low voltage" means a voltage level, which is provided to the SoC, as a driving voltage of a general logic circuit. The reference defining the "high voltage" and "low voltage" may change according to the development of low power technology.

Figure 1:
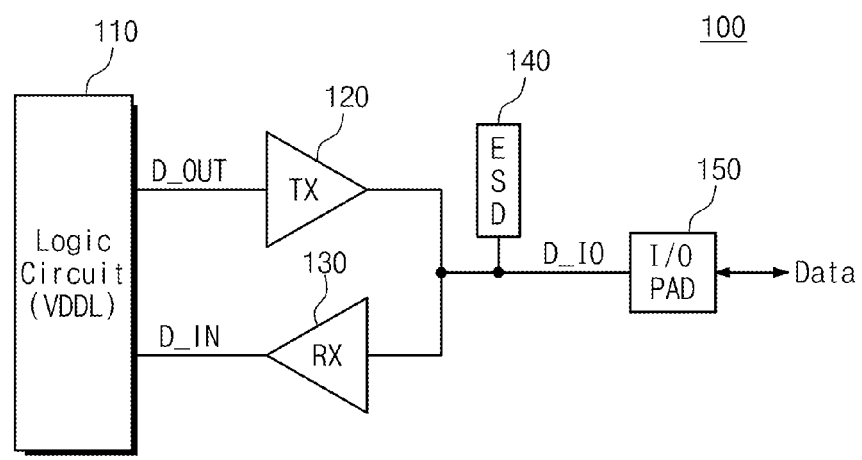
FIG. 1 is a block diagram illustrating a system-on-chip including a transmitter circuit and a receiver circuit according to an example embodiment of the inventive concepts.

FIG. 1 is a block diagram illustrating a system-on-chip including a transmitter circuit and a receiver circuit according to an example embodiment of the inventive concepts. Referring to FIG. 1, a system-on-chip 100 may include a logic circuit 110, a transmitter circuit 120, a receiver circuit 130, an electro static discharge (ESD) circuit 140, and an input/output pad 150.

The logic circuit 110 may be connected with the transmitter circuit 120 and the receiver circuit 130. The logic circuit 110 may be driven by a logic voltage VDDL. The logic circuit 110 may process data received from the outside through the receiver circuit 130 and sends the processed data to the outside. For example, in the case where the system-on-chip 100 is an application processor (AP) or a modem application processor (ModAP), the logic circuit 110 may include a circuit which is configured to process data, and exchange the processed data with a memory, a user interface, and/or an audio processor connected with the system-on-chip 100. In the case where the system-on-chip 100 is a memory chip, the logic circuit 110 may include elements such as a delay locked loop (DLL), a cell array, a decoder, and/or a sense amplifier. The logic circuit 110 may further include any circuit that is based on a function of the system-on-chip 100. Because an operating characteristic of the logic circuit 110 is not closely related to example embodiments of the inventive concepts, a detailed description thereof will not be repeated here.

A system-on-chip 100 may support all input/output signals of various voltage levels ranging from 1.2 V to 3.3 V to interface with various external chips, while a power supply voltage of the logic circuit 110 in the system-on-chip 100 may be, for example, 1.0 V or lower. In some example embodiments, the system-on-chip 100 may support driving voltages of various voltage levels of a high voltage or a low voltage by the DVFS operation to reduce power consumption.

The system-on-chip 100 may adjust driving voltages of the logic circuit 110, the transmitter circuit 120, and the receiver circuit 130 by performing the DVFS operation to efficiently manage power consumption and/or performance of the system-on-chip 100. For example, in the case where a workload of the system-on-chip 100 increases, the system-on-chip 100 may increase the driving voltages of the logic circuit 110, the transmitter circuit 120, and/or the receiver circuit 130 to increase a speed at which data is processed. In some example embodiments, even when a data transfer speed at which the system-on-chip 100 sends and receives data increases, the system-on-chip 100 may increase at least some of the driving voltages. When the workload of the system-on-chip 100 decreases or when the system-on-chip 100 sends and receives data at a lower transfer speed, the system-on-chip 100 may decrease at least some of the driving voltages to reduce power consumption.

Further, to easily manage power consumption and/or performance of the system-on-chip 100 described above, supply voltages of the logic circuit 110, the transmitter circuit 120, and/or the receiver circuit 130 may be divided. However, if the number of supply voltages divided in the system-on-chip 100 increases, design efficiency and integration of the system-on-chip 100 may deteriorate.

According to example embodiments of the inventive concepts, the transmitter circuit 120 and the receiver circuit 130 may use low voltage transistors having the same characteristic as transistors used in the logic circuit 110. For example, the threshold voltage of the low voltage transistors may be lower than those of transistors used in an interface circuit. Accordingly, performance of the transmitter circuit 120 and the receiver circuit 130 may be secured at a low voltage. Because the transmitter circuit 120 and the receiver circuit 130 operate at the low voltage, power consumption thereof may decrease. Furthermore, in the case where the transmitter circuit 120 and the receiver circuit 130 use the same low-voltage transistors as used the transistors used in the logic circuit 110, a plurality of voltage sources dedicated for an interface circuit (not shown) are not desired to secure the performance of the transmitter circuit 120 and the receiver circuit 130. Thus, the transmitter circuit 120 and the receiver circuit 130 may operate at a voltage source dedicated to the interface circuit.

Because voltage levels of the logic voltage VDDL and the interface circuit vary according to the performance and power consumption characteristics of the system-on-chip 100, the transmitter circuit 120 and the receiver circuit 130 may include an additional circuit configured to change data in a voltage domain.

The transmitter circuit 120 according to an example embodiment of the inventive concepts may transmit data received through the logic circuit 110 to the outside through the input/output pad 150. The transmitter circuit 120 may be driven by the logic voltage VDDL and the interface voltage VDDH. As such, the transmitter circuit 120 may include a level shifter that converts a level of the logic voltage VDDL of data into a level of an interface voltage VDDH. Configurations and operations of the transmitter circuit 120 will be described with reference to FIG. 2 to FIG. 10 in detail.

The receiver circuit 130 according to an example embodiment of the inventive concepts may receive data through the input/output pad 150 and may provide the received data to the logic circuit 110. The receiver circuit 130 may include an input buffer (hereinafter referred to as "LS buffer") that receives data of a low-frequency band, and an input buffer (hereinafter referred to as "HS buffer") that receives data of a high-frequency band. As the LS and HS buffers are driven by the separate supply voltages, respectively, the receiver circuit 130 may not need a separate provision of a shifter register for converting a voltage level of data. A structure and an operation of the receiver circuit 130 will be described with reference to FIG. 11 to FIG. 14 in more detail.

The ESD circuit 140 may mitigate or prevent damage of an internal circuit from an instantaneous high voltage generated from the outside. For example, the ESD circuit may be implemented with a combination of a diode and a resistor. The input/output pad 150 may be connected to an external channel, and the system-on-chip 100 may send/receive data to/from the outside through the input/output pad 150. The transmitter circuit 120, the receiver circuit 130, the ESD circuit, and the input/output pad 150 may be connected to each other through a node D_IO. Because an operating characteristic of the ESD circuit 140 and the input/output pad 150 is not closely related to example embodiments of the inventive concepts, a detailed description thereof will not be repeated here.

Figure 2:
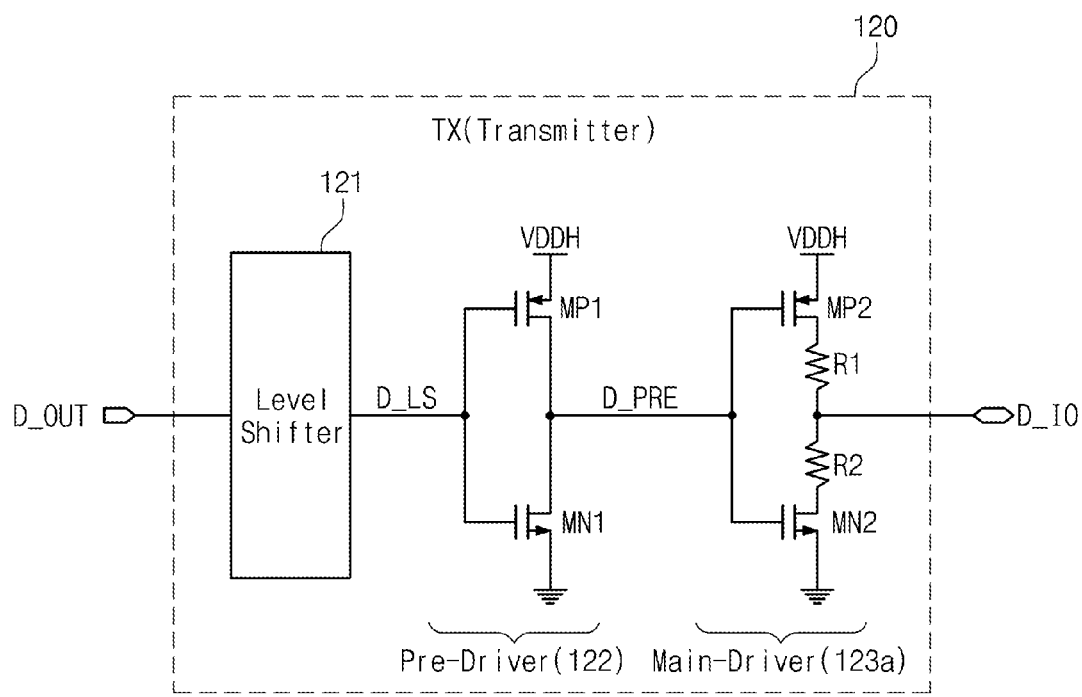
FIG. 2 is a circuit diagram illustrating the transmitter circuit illustrated in FIG. 1.

FIG. 2 is a circuit diagram illustrating the transmitter circuit illustrated in FIG. 1. Referring to FIG. 2, the transmitter circuit 120 may include a level shifter 121, a pre-driver 122, and a main-driver 123a. FIG. 2 will be described with reference to FIG. 1. An interface voltage VDDH may be set to be higher than, equal to, or lower than the logic voltage VDDL for the DVFS operation.

The level shifter 121 may be connected between the logic circuit 110 and the pre-driver 122. The level shifter 121 may convert a voltage level of data transmitted from the logic circuit 110 into a voltage level which the pre-driver 122 and the main-driver 123a can process. That is, the level shifter 121 may convert a level of data, which swings between the logic voltage VDDL and a ground (GND) voltage, into a signal level which swings between the interface voltage VDDH and the GND voltage. Accordingly, a short-circuit current generated when a signal of a low voltage level is provided to an input of a circuit driven by a high voltage may be mitigated or prevented.

The pre-driver 122 may be connected between the level shifter 121 and the main-driver 123a. The pre-driver 122 may operate as a buffer of the main-driver 123a. That is, the pre-driver 122 may be provided with data from the level shifter 121 and may transmit the provided data to an input node of the main-driver 123a. The pre-driver 122 may be implemented with an inverter including a first PMOS transistor MP1 and a first NMOS transistor MN1. In FIG. 2, the pre-driver 122 may be implemented with a one stage inverter. In some example embodiments, the pre-driver 122 may be implemented with an inverter circuitry including a plurality of stages. Moreover, for example, the pre-driver 122 may be configured to respectively provide classified signal paths with respect to second PMOS and NMOS transistors MP2 and MN2, which constitute the main-driver 123a.

The main-driver 123a may transmit data, which is provided from the pre-driver 122, to the input/output pad 150. The main-driver 123a may have an "A" type structure, which refers to a structure composed of the second PMOS and NMOS transistors MP2 and MN2. The second PMOS transistor MP2 and a first resistor R1 may be connected in series between the interface voltage VDDH and the node D_IO. The second NMOS transistor MN2 and a second resistor R2 may be connected in series between the node D_IO and the GND. Gates of the second PMOS and NMOS transistors MP2 and MN2 may constitute the input node of the main-driver 123a, and the input node of the main-driver 123a may be connected with a node D_PRE, which is an output node of the pre-driver 122.

When the main-driver 123a transmits data to the outside, the main-driver 123a may be connected with the external channel. Accordingly, to prevent reflected waves of a channel upon transmission of data, the main-driver 123a may perform an operation for impedance matching with the channel. As such, the transmitter circuit 120 may further include a ZQ calibration circuit (not illustrated) that adjusts an output impedance of the main-driver 123a. In FIG. 2, only the second PMOS and NMOS transistors MP2 and MN2 and resistors R1 and R2 are illustrated. However, example embodiments are not limited thereto. Each element of FIG. 2 may be implemented with two or more devices that are connected in parallel to each other. Furthermore, in some cases, when the system-on-chip 100 receives data, the main-driver 123a may operate as on-die termination (ODT).

In the case of the system-on-chip 100 for a mobile device, the system-on-chip 100 may lower a signal level of data, which is transmitted by the main-driver 123a, to reduce power consumption thereof. As such, the system-on-chip 100 may decrease the interface voltage VDDH. When data of low frequency is transmitted, a high-performance operation is not desired, and thus the transmitter circuit 120 may decrease the interface voltage VDDH by the DVFS operation. As described with reference to FIG. 1, the transmitter circuit 120 according to an example embodiment of the inventive concepts may be implemented with low-voltage transistors for supporting an input/output signal of the low-voltage. Accordingly, the transmitter circuit 120 may be driven by a low voltage such as the logic voltage VDDL. However, to independently control driving voltage levels of the transmitter circuit 120 and the receiver circuit 130, the interface voltage VDDH, which is different from the logic voltage VDDL, may be used. Furthermore, transmission quality of the transmitter circuit 120 and the receiver circuit 130 may be secured under the interface voltage VDDH of a low level.

Figure 3:
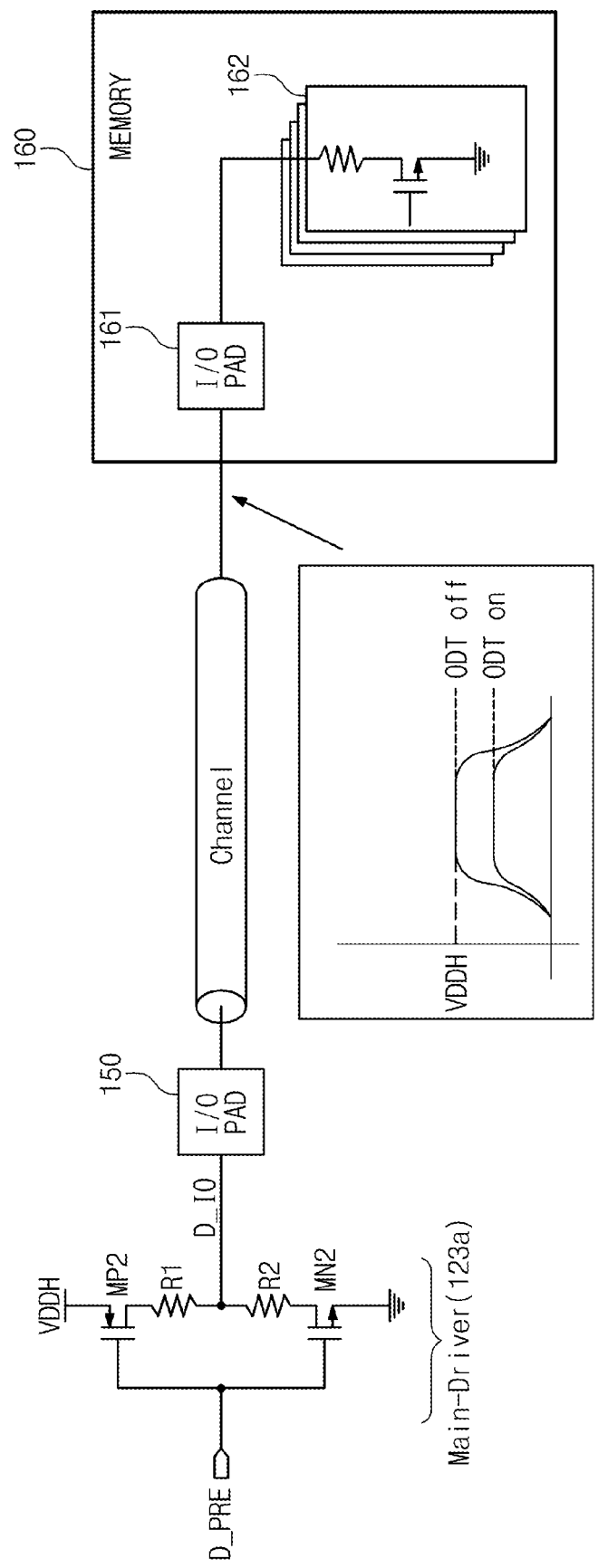
FIG. 3 is a drawing illustrating an output signal of the main-driver illustrated in FIG. 2.

FIG. 3 is a drawing illustrating an output signal of the main-driver illustrated in FIG. 2. Referring to FIG. 3, the main-driver 123a of FIG. 2 may send data to a memory 160 through a channel. FIG. 3 will be described with reference to FIG. 1.

Data developed by the main-driver 123a of the system-on-chip 100 may be provided to the channel through the input/output pad 150. The provided data may be transmitted to an input/output pad 161 of the memory 160 through the channel. A voltage level of data at the input/output pad 161 of the memory 160 may vary according to whether an ODT 162 is used.

In FIG. 3, the voltage level of the data passing through the channel is illustrated. When the transmitted data is a logical '0,' the input/output pad 161 of the memory 160 may be connected to the GND through the second resistor R2 and the second NMOS transistor MN2. Accordingly, the voltage level of the data passing through the channel may be the GND voltage regardless of whether the ODT 162 is turned on. When the transmitted data is a logical '1,' the input/output pad 161 of the memory 160 may be connected to the interface voltage VDDH through the first resistor R1 and the second PMOS transistor MP2. In this case, a voltage level of the transmitted data may vary according to whether the ODT 162 is turned on. When the ODT 162 is turned off, the transmitted data may have a level of the interface voltage VDDH. In contrast, when the ODT 162 is turned on, the transmitted data signal may have a level of a voltage divided between the second PMOS transistor MP2, the first resistor R1, and the ODT 162. The level of the divided voltage may be lower than that of the interface voltage VDDH.

For example, the memory 160 may include the ODT 162 of any form. In this case, a swing level of the transmitted data may vary according to the form of the ODT 162. In some example embodiments, the memory 160 may not include the ODT 162.

For example, the memory 160 may include a volatile memory including a dynamic random access memory (DRAM) and a static random access memory (SRAM), or a nonvolatile memory.

The volatile memory may include a DRAM such as a low power DDR4 (LPDDR4) or LPDDR4X memory, an SRAM, a thyristor RAM (TRAM), a zero capacitor RAM (Z-RAM), a twin transistor RAM (TTRAM), or a MRAM.

The nonvolatile memory may be an electrically erasable programmable read-only memory (EEPROM), a flash memory, a magnetic RAM (MRAM), a spin-transfer torque MRAM (STT-MRAM), a conductive bridging RAM (CBRAM), a ferroelectric RAM (FeRAM), a phase change RAM (PRAM), a resistive RAM (RRAM), a nanotube RRAM (RRAM), a polymer RAM (PoRAM), a nano-floating gate memory (NFGM), a holographic memory, a molecular electronic memory device, or an insulator resistance change memory. One or more bits may be stored in a unit cell of a nonvolatile memory.

In FIG. 3, the memory 160 is illustrated as one of external chips connected to the system-on-chip 100. This is only an example. For example, the system-on-chip 100 may be connected to a chip including various functions such as an audio processor, an image processor, a controller, and application specific integrated circuits (ASIC). Because an operating characteristic of the memory 160 is not closely related to example embodiments of the inventive concepts, a detailed description thereof will not be repeated here.

Figure 4:
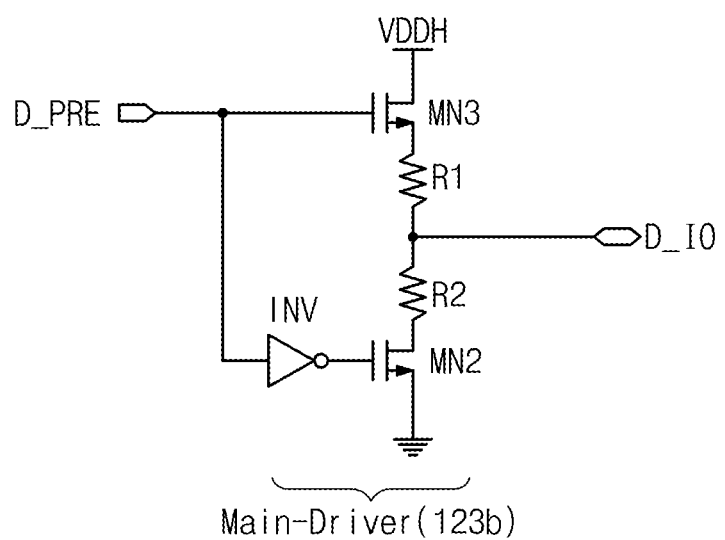
FIG. 4 is a circuit diagram illustrating another example embodiment of the main-driver illustrated in FIG. 2.

FIG. 4 is a circuit diagram illustrating another example embodiment of the main-driver illustrated in FIG. 2. Referring to FIG. 4, a main-driver 123b may include second and third NMOS transistors MN2 and MN3, first and second resistors R1 and R2, and an inverter INV. The main-driver 123b of FIG. 4 may have a "B" type structure, which refers to a structure composed of the second and third NMOS transistors MN2 and MN3. FIG. 4 will be described with reference to FIG. 2.

The third NMOS transistor MP3 and the first resistor R1 may be serially connected between the interface voltage VDDH and the node D_IO. The second resistor R2 and the second NMOS transistor MN2 may be connected between the node D_IO and the GND. Gates of the second and third NMOS transistors MN2 and MN3 may constitute an input node of the main-driver 123b. The input node of the main-driver 123b may be provided with data from the pre-driver 122. The main-driver 123b of FIG. 4 may be different from the main-driver 123a of FIG. 2 in that the second NMOS transistor MN2 is provided with data inverted by the inverter INV. As such, one of the second and third NMOS transistors MN2 and MN3 may be turned on according to data of the node D_PRE. For example, a gate of the third NMOS transistor MN3 may be provided with inverted data by the inverter INV, and a gate of the second NMOS transistor MN2 may be directly provided with data (e.g., uninverted data) from the pre-driver 122. A transmission operation of the main-driver 123b and a voltage level of the transmitted data will be described with reference to FIG. 5.

Figure 5:
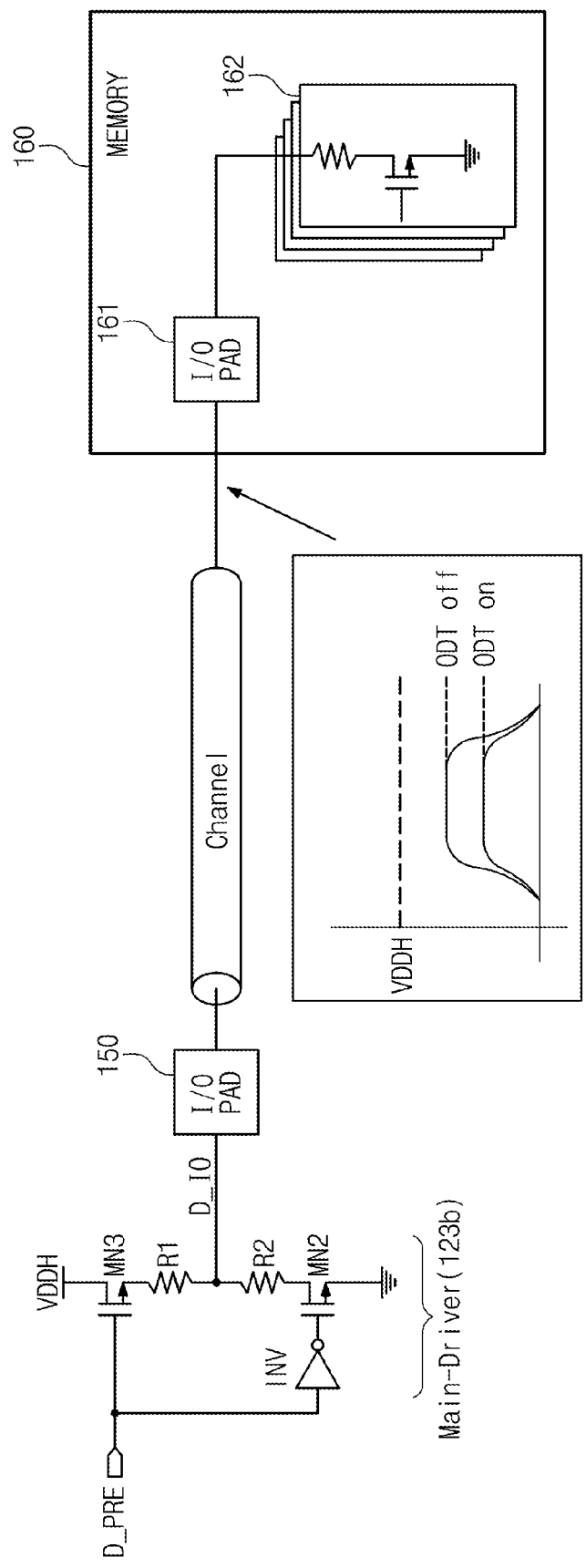
FIG. 5 is a drawing illustrating an output signal of the main-driver illustrated in FIG. 4.

FIG. 5 is a drawing illustrating an output signal of the main-driver illustrated in FIG. 4. In FIG. 5, the main-driver 123b may be substantially the same as the main-driver 123a of FIG. 3 except that the main-driver 123b has the B-type structure, and thus, a detailed description thereof will not be repeated here.

In FIG. 5, a voltage level of data transmitted through a channel is illustrated. When the transmitted data is a logical '0,' as in FIG. 3, data passing through the channel may have a level of the GND voltage regardless of whether the ODT 162 is turned on. When the transmitted data is a logical '1,' a voltage level of the transmitted data may vary according to whether the ODT 162 is turned on. When the ODT 162 is turned off, a voltage level of the transmitted data may be determined according to a threshold voltage value of the third NMOS transistor MN3. That is, a voltage level of the transmitted data may be a voltage level, of "Vgs−Vth." Here, "Vgs" is a gate input voltage of the third NMOS transistor MN3, and "Vth" is a threshold voltage of the third NMOS transistor MN3. The reason is that the voltage level of the node D_IO increases until the third NMOS transistor MN3 is turned off. When the ODT 162 is turned on, a voltage level of the transmitted data may be a level of a voltage which is divided between the third NMOS transistor MN3, the first resistor R1, and the ODT 162.

Compared to the A type main-driver 123a of FIG. 3, the B type main-driver 123b may transmit a signal of a voltage lower than the interface voltage VDDH. As such, compared to the A type main-driver 123a, the B type main-driver 123b may transmit a signal of a swing level smaller than a swing level of the A type main-driver 123a. Accordingly, power consumption can be reduced by the main-driver 123b. Further, a physical size of the main-driver 123b may be reduced as NMOS transistors are used instead of PMOS transistors. Still further, because pull-up and pull-down drivers are implemented with the same NMOS transistors, a symmetric characteristic of the pull-up and pull-down drivers may be improved. Because the swing level of the main-driver 123b is determined by the threshold voltage of the third NMOS transistor MN3, the transmission quality of a signal may be affected by a threshold voltage distribution.

Figure 6:
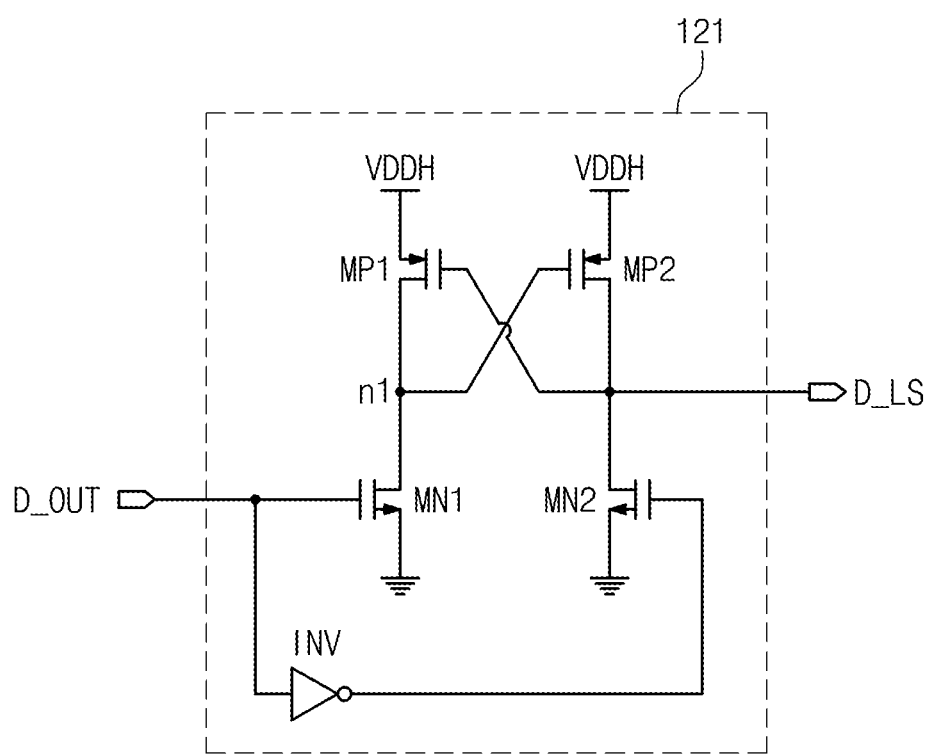
FIG. 6 is a circuit diagram illustrating the level shifter illustrated in FIG. 2.

FIG. 6 is a circuit diagram illustrating the level shifter illustrated in FIG. 2. Referring to FIG. 6, the level shifter 121 may include first and second input transistors MN1 and MN2, first and second latch transistors MP1 and MP2, and an inverter INV. The level shifter 121 converts a voltage level of an input signal into a level of the interface voltage VDDH, which is a driving voltage of the level shifter. FIG. 6 will be described with reference to FIGS. 1 and 2.

The first and second input transistors MN1 and MN2 may be provided with data from the logic circuit 110 through the node D_OUT. The provided data may swing with a level of the logic voltage VDDL. The first input transistor MN1 may be directly provided with input data, and the second input transistor MN2 may be provided with data which is inverted through the inverter INV. The first and second input transistors MN1 and MN2 may invert and amplify the provided data and may provide the inverted and amplified data to nodes n1 and D_LS.

First and second latch transistors MP1 and MP2 may constitutes a latch. The first and second latch transistors MP1 and MP2 may pull up or pull down voltages of the nodes n1 and D_LS, which vary according to the input data, into the interface voltage VDDH or the GND voltage. For example, when data of the node D_OUT is a logical '0', the node n1 may be pulled up to the interface voltage VDDH, and the node D_LS may become the GND voltage, by the first and second latch transistors MP1 and MP2. When data of the node D_OUT is a logical '1', the node n1 may be pulled down to the GND voltage, and the node D_LS may be pulled up to the interface voltage VDDH.

A structure of the level shifter 121 illustrated in FIG. 6 is only an example, and the level shifter 121 may have a level shifter structure of any form. For example, the level shifter 121 may have a single input level shifter structure in which only one input is provided.

FIGS. 7 to 10 are circuit diagrams of the transmitter circuit illustrated in FIG. 1, according to some example embodiments. Configurations and operations of elements (e.g., a pre-driver, a main driver, and/or a level shifter) that are included in transmitter circuits 220 to 520 illustrated in FIGS. 7 to 10 may be the same as those elements illustrated in FIGS. 2 to 6. Thus, a detailed description thereof will not be repeated here. Further, the main-driver may include an A type configuration, a B type configuration, or both types of configurations.

Figure 7:
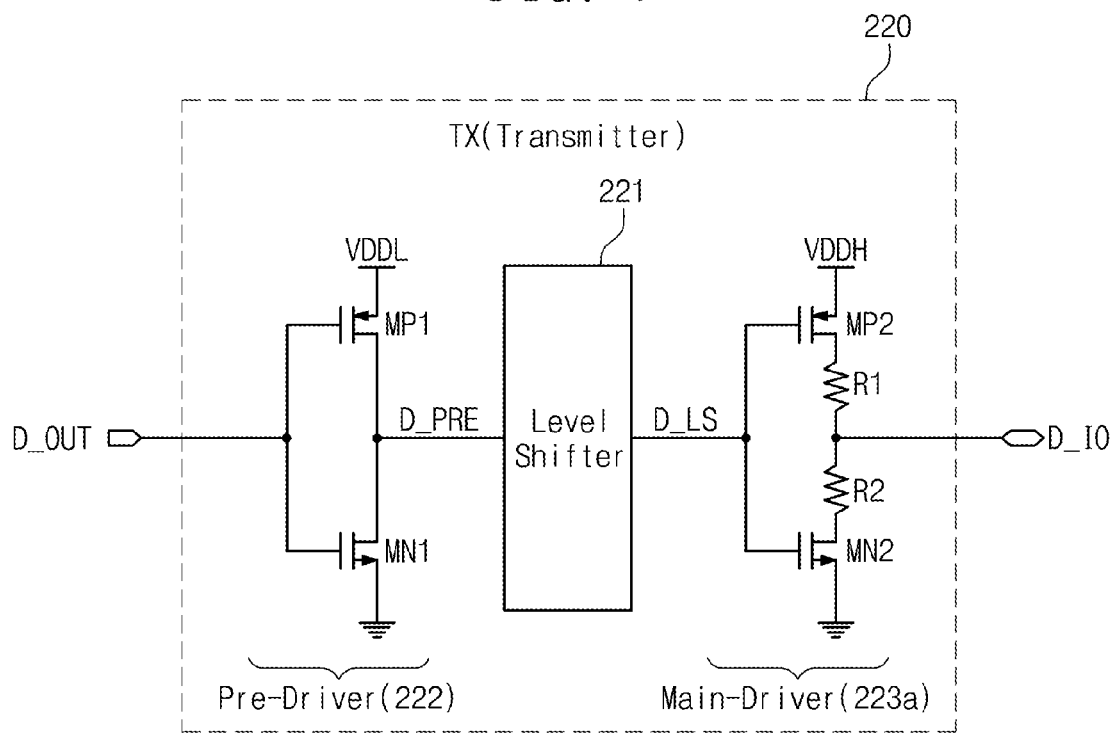
FIGS. 7 to 10 are circuit diagrams of the transmitter circuit illustrated in FIG. 1, according to some example embodiments.

Referring to FIG. 7, the transmitter circuit 220 may include a level shifter 221, a pre-driver 222, and a main-driver 223a. The transmitter circuit 220 of FIG. 7 may be different from the transmitter circuit 120 of FIG. 2 in that the pre-driver 222 is driven by the logic voltage VDDL and in that the level shifter 221 is connected between the pre-driver 222 and the main-driver 223a. Except for the differences described above, because elements and operations of the transmitter circuit 220 of FIG. 7 are the same as those of the transmitter circuit illustrated in FIG. 2, a detailed description thereof will not be repeated here.

Figure 8:
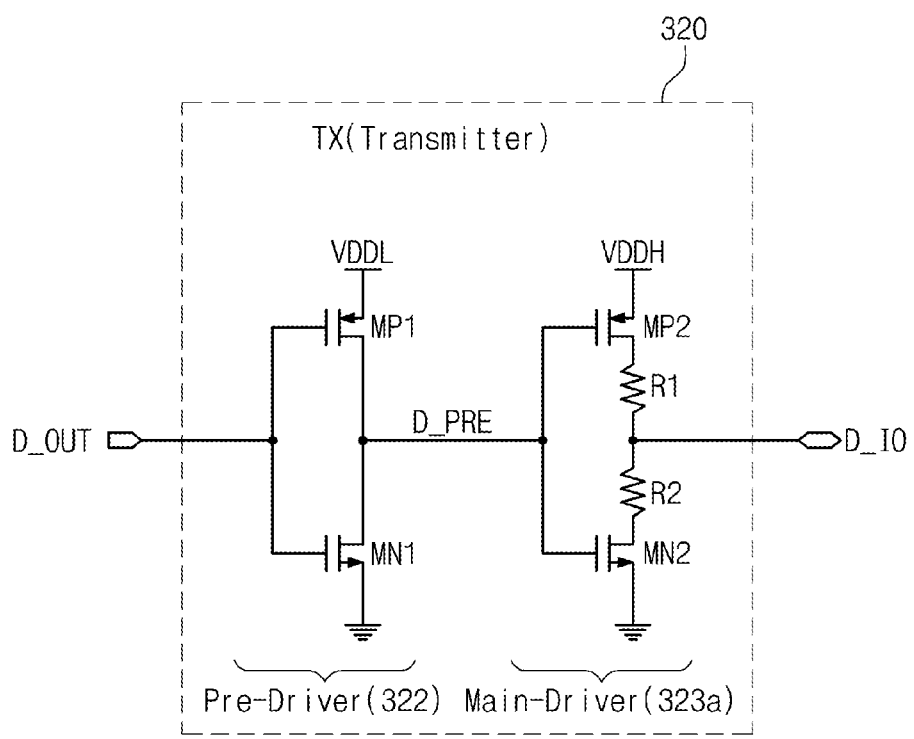

Referring to FIG. 8, a transmitter circuit 320 may include a pre-driver 322, and a main-driver 323a. The pre-driver 322 and the main-driver 323a of FIG. 8 may be different from the pre-driver 122 and the main-driver 123a of FIG. 2 in that the level shifter 221 are not used because the pre-driver 322 and the main-driver 323a are driven by the logic voltage VDDL. The reason is that the pre-driver 322 and the main-driver 323a are implemented with low-voltage transistors having low threshold voltages. In this case, because the system-on-chip 100 including the transmitter circuit 320 of FIG. 8 does not use a separate interface voltage, difficulty in designing the system-on chip 100 may be lowered, and cost for designing the system-on chip 100 may be reduced.

The transmitter circuits 120, 220 and 320 of FIGS. 2, 7, and 8 may include substantially the same configuration. The designers may select one of the configurations of the transmitter circuits 120, 220 and 320 of FIGS. 2, 7, and 8 based on design considerations. For example, the design considerations may include difficulty in design, the number of control signals of a transmitter circuit, and/or data transmission quality.

Figure 9:
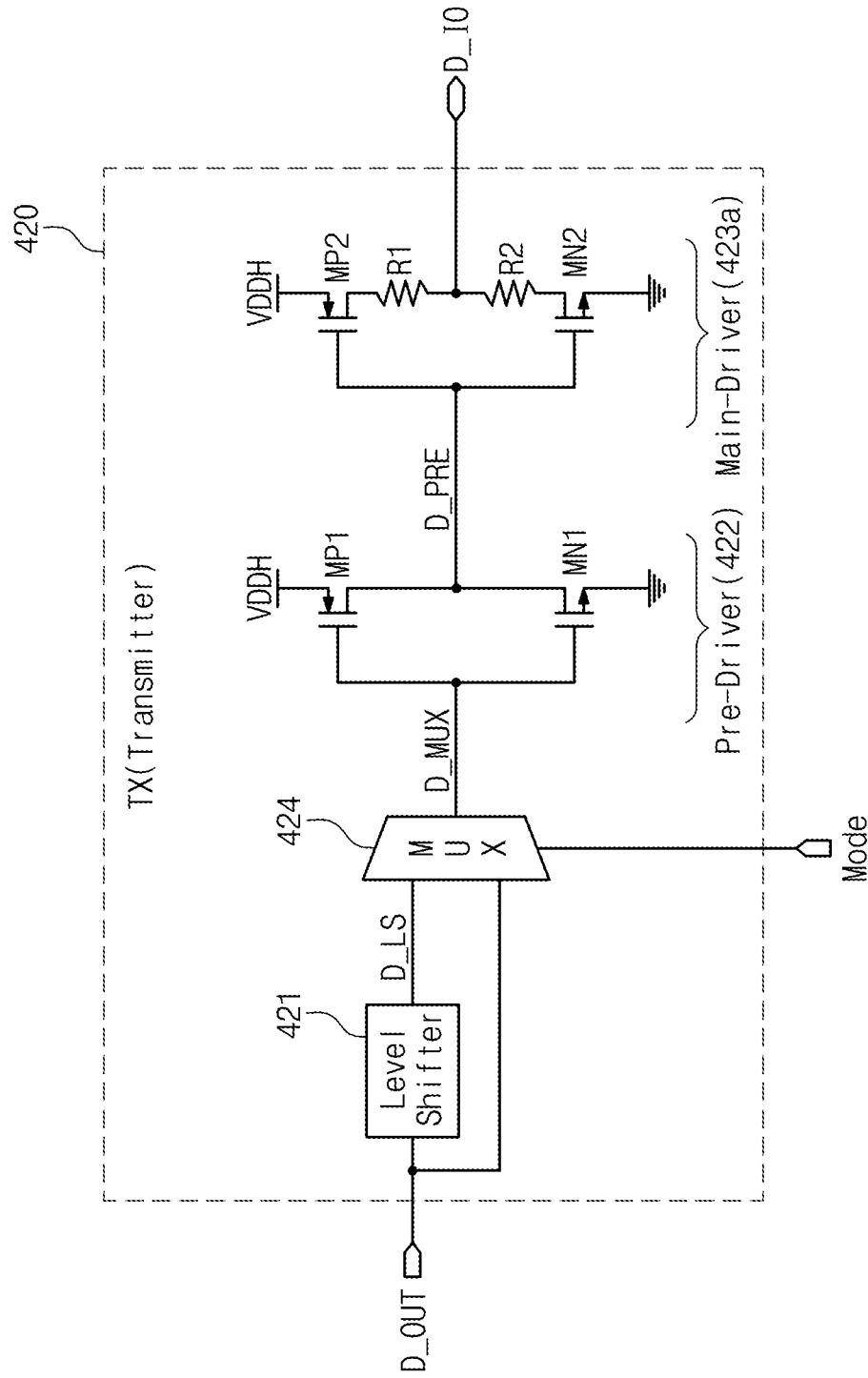

Referring to FIG. 9, a transmitter circuit 420 may include a level shifter 421, a pre-driver 422, a main-driver 423a, and a multiplexer 424. The transmitter circuit 420 may select a transmission path of data to be provided through the node D_OUT by the multiplexer 424. Below, a path where data passes through the level shifter 421 may be referred to as a "first path", and a path where data does not pass through (e.g., bypass) the level shifter 421 may be referred to as a "second path".

When a voltage level of the interface voltage VDDH is greater than a voltage level of the logic voltage VDDL, the transmitter circuit 420 may select the first path to mitigate or prevent power consumption due to a short-circuit current. That is, to prevent the occurrence of the short-circuit current of the pre-driver 422 by an input voltage lower than the interface voltage VDDH, a level of the input voltage may be converted into a level of the interface voltage VDDH through the first path.

When the voltage level of the interface voltage VDDH is equal to or lower than that of the logic voltage VDDL, the transmitter circuit 420 may select the second path. That is, when the interface voltage VDDH is lower than the logic voltage VDDL, the short-circuit current may not occur in the pre-driver 422, Thus, converting a voltage level of data may not be needed (meaning that data may not pass through the level shifter 421). Accordingly, when combination of driving voltages, that does not need the level shifter by the DVFS operation, is used, the transmitter circuit 420 of FIG. 9 may select the second path, thereby reducing a propagation delay time of a data signal. The first or second path may be selected by the multiplexer 424 based on a mode control signal Mode, and a method of determining the mode control signal Mode will be described below.

The multiplexer 424 may be controlled by the mode control signal Mode and may determine a transmission path of data provided through the node D_OUT. Data passing through one of the first and second paths, which is selected by the multiplexer 424, may be provided to the pre-driver 422.

The mode control signal Mode may be determined according to an operating frequency of the system-on-chip 100 of FIG. 1. That is, the operating frequency of the system-on-chip 100 may be determined according to a frequency of data to be transmitted/received, and the DVFS operation may be performed based on the operating frequency. That is, the system-on-chip 100 may adjust a voltage level of the interface voltage VDDH based on the operating frequency.

For example, when the operating frequency of the system-on-chip 100 is higher than a reference frequency, to maintain data transmission quality, the system-on-chip 100 may operate to set such that the interface voltage VDDH is higher than the logic voltage VDDL. In this case, the first path may be selected. When the operating frequency of the system-on-chip 100 is lower than the reference frequency, to reduce the power consumption, the system-on-chip 100 may make the interface voltage VDDH equal to or lower than the logic voltage VDDL. In this case, the second path may be selected.

In this specification, one example of determining the mode control signal Mode is described. However, the mode control signal Mode may be determined by any algorithm according to the DVFS operation. For example, the mode control signal Mode may be determined by the logic circuit 110 of FIG. 1 or an external controller.

Figure 10:
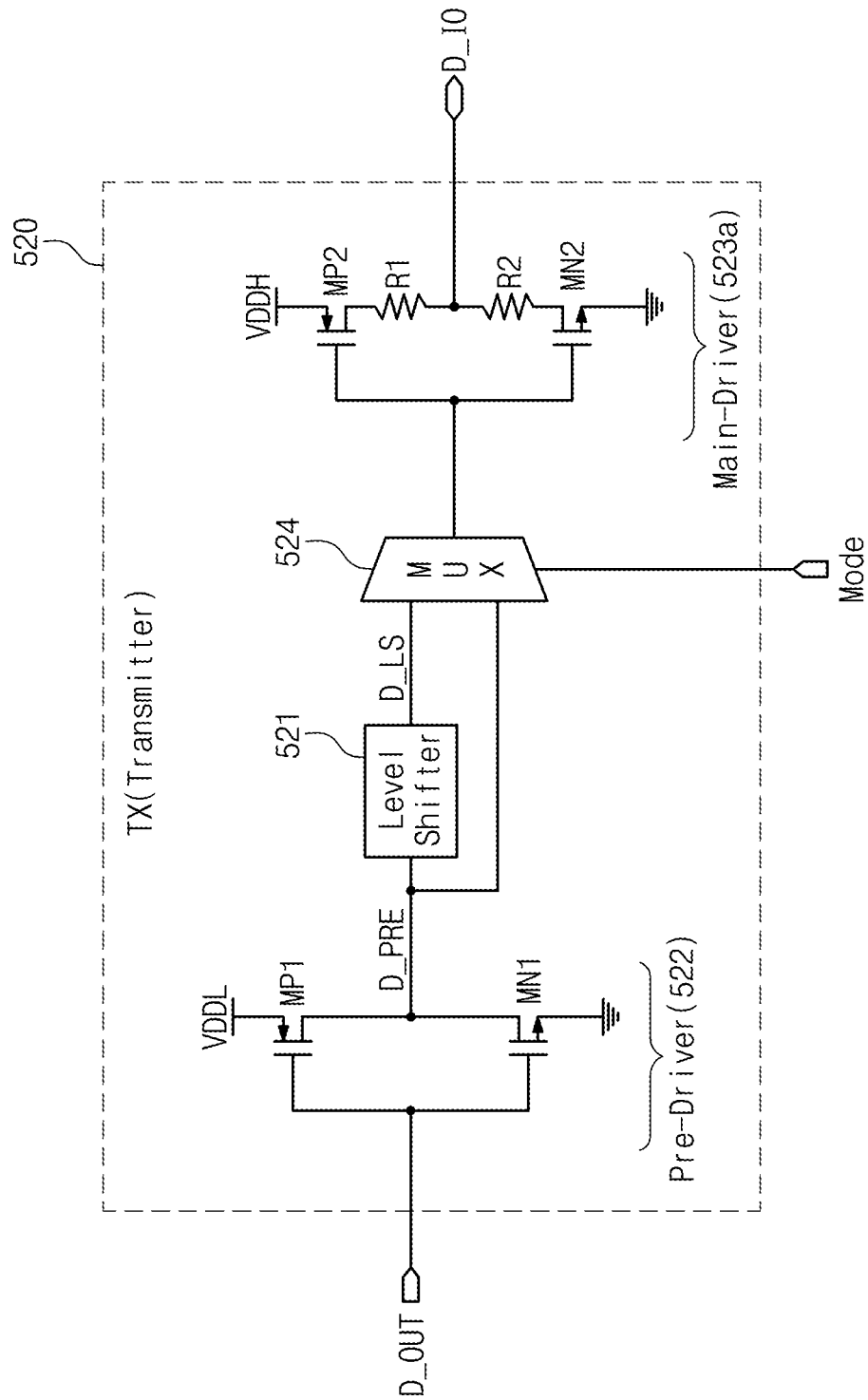

Referring to FIG. 10, a transmitter circuit 520 may include a level shifter 521, a pre-driver 522, a main-driver 523a, and a multiplexer 524. The configuration and operation of the transmitter circuit 520 of FIG. 10 are substantially the same as those of FIG. 9 except that the level shifter 521 and the multiplexer 524 are connected between the pre-driver 522 and the main-driver 523a. Thus, a detailed description thereof will not be repeated here.

Figure 11:
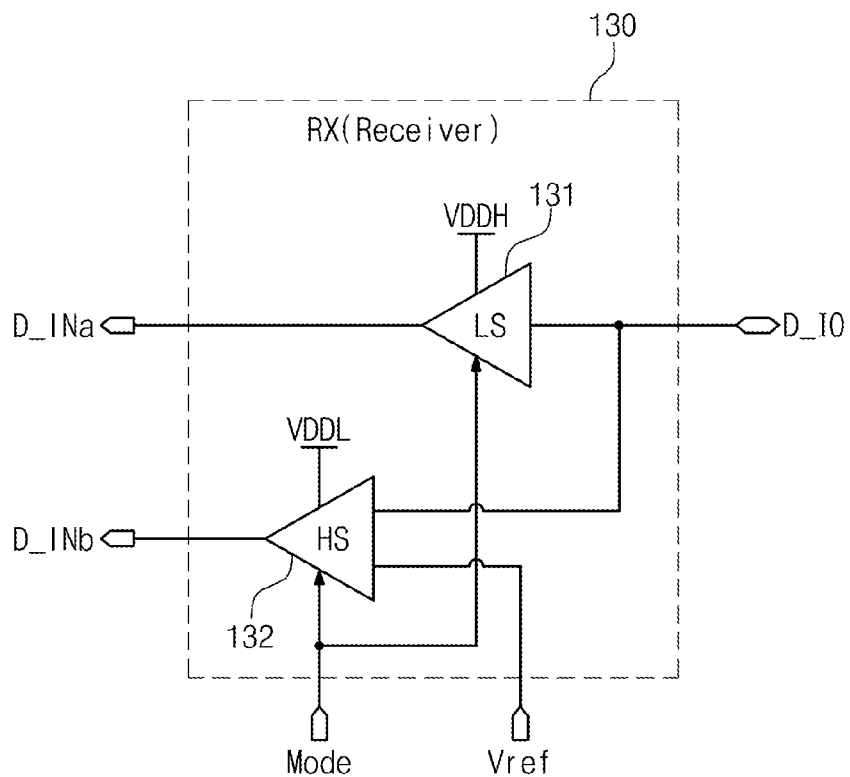
FIG. 11 is a block diagram illustrating the receiver circuit illustrated in FIG. 1.

FIG. 11 is a circuit diagram illustrating the receiver circuit illustrated in FIG. 1. Referring to FIG. 11, the receiver circuit 130 may include an LS buffer 131 and a HS buffer 132. FIG. 11 will be described with reference to FIG. 1. The receiver circuit 130 may selectively use one of the LS buffer 131 and the HS buffer 132 based on the mode control signal Mode. The mode control signal Mode of FIG. 11 may be the same control signal as the control signal of FIG. 9, and thus, a detailed description thereof will not be repeated here.

The LS buffer 131 may receive data which is transmitted through the node D_IO and may provide the received data to the logic circuit 110 through an output node D_Ina. The LS buffer 131 may be driven by the interface voltage VDDH and may be implemented to receive data of a low frequency. In FIG. 11, the LS buffer 131 is illustrated as not using a reference voltage. This is only an example. For example, the LS buffer 131 may be implemented to use a reference voltage. An example configuration of the LS buffer 131 will be described with reference to FIG. 12.

The HS buffer 132 may receive data which is transmitted through the node D_IO and may provide the received data to the logic circuit 110 through an output node D_INb. The HS buffer 132 may be driven by the logic voltage VDDL and may be implemented to receive data of a high frequency. An example configuration of the HS buffer 132 will be described with reference to FIG. 13.

As illustrated in FIG. 11, the output nodes D_INa and D_INb of the LS buffer 131 and the HS buffer 132 may be separated from each other for the logic circuit 110 to separately process transmitted data based on voltage levels of the output nodes D_INa and D_INb.

For example, when a level of the logic voltage VDDL is higher than that of the interface voltage VDDH, a short-circuit current may be generated in the logic circuit 110 due to a low voltage of data provided through the output node D_INa. In this case, the logic circuit 110 may further include a level shifter for data provided through the separated output node D_INa. Because a voltage swing level of data provided through the output node D_INb swings with a level of the same logic voltage VDDL as that in the logic circuit 110, the logic circuit 110 can directly receive the data provided through the output node D_INb.

However, when the logic voltage VDDL is equal to or lower than the interface voltage VDDH, the logic circuit 110 may not need a level shifter, and thus the output nodes D_INa and D_INb may be integrated.

As described above, according to the DVFS operation, the system-on-chip 100 of FIG. 1 may change an operating voltage of the logic circuit 110 and the receiver circuit 130. In this case, operating performance of the system-on-chip 100 may be determined according to the performance of the logic circuit 110 and/or the receiver circuit 130. As such, the receiver circuit 130 according to an example embodiment of the inventive concepts may include the LS buffer 131 and the HS buffer 132, of which operating voltages and circuit configurations are separated from each other, to efficiently receive data, even when the logic voltage VDDL or interface voltage VDDH changes according to the DVFS operation.

When buffers are separated according to the operating voltages and circuit configurations, characteristics of the buffers according to the DVFS operation may be easily managed. For example, when the logic voltage VDDL of a high level is used on data of the same operating frequency, the LS buffer 131 may be driven by the interface voltage VDDH of a relatively low level. Accordingly, the receiver circuit 130 may operate without being affected by the logic voltage VDDL, thereby reducing power consumption. In some example embodiments, to improve transmission quality in the same situation, the receiver circuit 130 may select and use the HS buffer 132 of high performance driven by the logic voltage VDDL of a relatively high level.

Furthermore, using separate buffers as described above may have additional benefits. Compared to multi-purpose circuits, a dedicated circuit for one purpose may have high operating efficiency and may be advantageous for design optimization. For example, because the LS buffer 131 receives data of a low frequency, the LS buffer 131 may be designed to operate at a low performance to mitigate power consumption. That is, the LS buffer 131 may be designed as a low performance buffer so as to receive only a data signal of a low swing level of a low frequency. The HS buffer 132 may be designed as a high-performance buffer that receives a data signal of a high swing level. Accordingly, the LS buffer 131 and the HS buffer 132 may be designed to have the characteristics optimized or improved, and/or an area occupied by the buffer of the dedicated circuit may be reduced.

Figure 12:
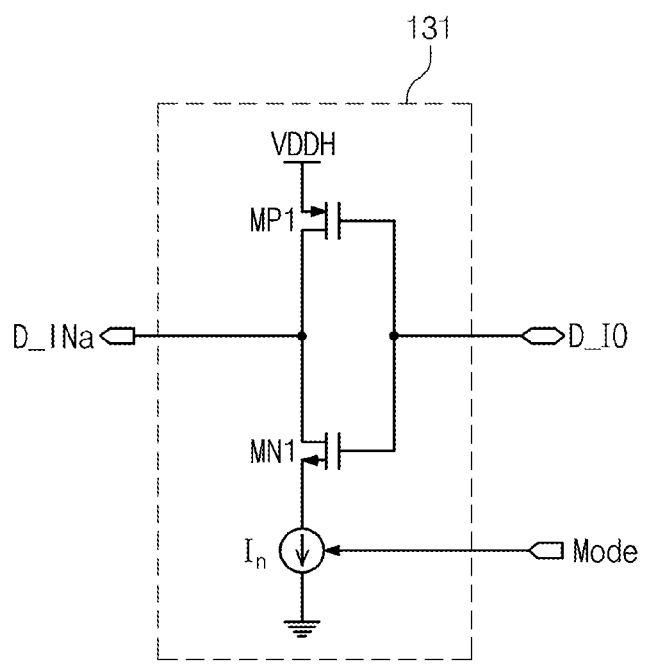
FIG. 12 is a circuit diagram illustrating the LS buffer illustrated in FIG. 11.

FIG. 12 is a circuit diagram illustrating the LS buffer illustrated in FIG. 11. Referring to FIG. 12, the LS buffer 131 may include a first PMOS transistor MP1, a first NMOS transistor MN1, and a current source $I_n$. The LS buffer 131 of FIG. 12 may operate as an inverter.

The first PMOS transistor PM1 and NMOS transistors MN1 constitute an inverter and receive data through gates thereof, respectively. The current source $I_n$ is serially connected between a source node of the first NMOS transistor MN1 and the ground GND. The current source $I_n$ may provide a constant current to the LS buffer 131 and may be controlled by the mode control signal Mode. The LS buffer 131 may be turned on/off according to whether the current source $I_n$ is turned on/off.

The LS buffer 131 of FIG. 12 may distinguish a signal level of data, which is received through the node D_IO, based on a logic threshold voltage of the inverter. In FIG. 12, an inverter structure is illustrated as an example of the LS buffer 131. This is only an example. For example, the LS buffer 131 may not be limited to FIG. 12 and may be implemented with any circuit having a buffer function.

Figure 13:
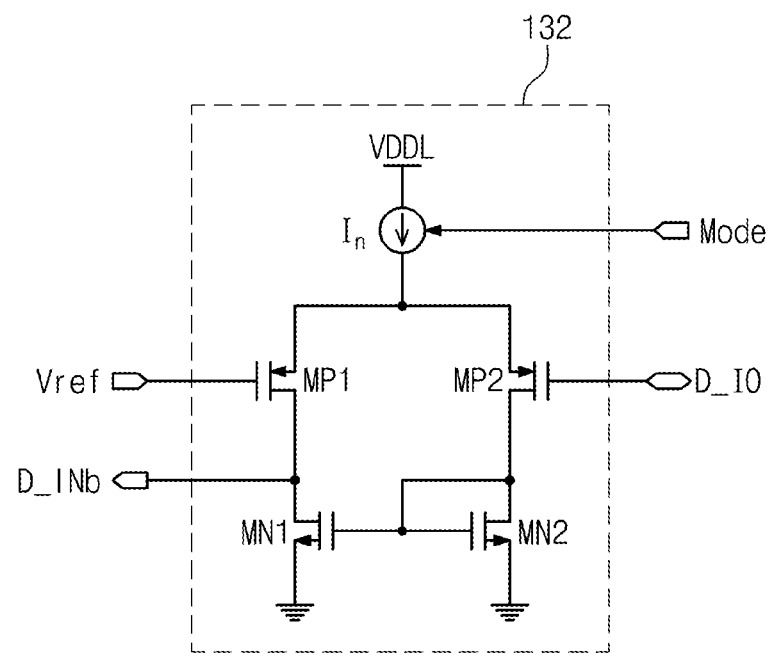
FIG. 13 is a circuit diagram illustrating the HS buffer illustrated in FIG. 11.

FIG. 13 is a circuit diagram illustrating the HS buffer illustrated in FIG. 11. Referring to FIG. 13, the HS buffer 132 may include first and second input transistors MP1 and MP2, first and second load transistors MN1 and MN2, and a current source $I_p$. The HS buffer 132 of FIG. 13 may operate as a differential amplifier.

The first input transistor MP1 may be implemented with a PMOS transistor and may be provided with a reference voltage $V_{ref}$ as an input. For example, a level of the reference voltage $V_{ref}$ may be a voltage level of "VDDL/2". The second input transistor MP2 may be implemented with a PMOS transistor and may receive data through the node D_IO. The HS buffer 132 of FIG. 13 may receive data through the PMOS transistor to receive data swing with a low voltage level by low voltage swing terminated logic (LVSTL) technology. This is only an example. For example, each of the first and second input transistors MP1 and MP2 may be implemented with an NMOS transistor based on the data swing level.

The first and second load transistors MN1 and MN2 constitute a current mirror. Each of the first and second load transistors MN1 and MN2 may be implemented with an NMOS transistor and may operates as a load with regard to an output data signal of the HS buffer 132. As such, an output signal may be provided to the output node D_INb through a drain node of the first load transistor MN1.

The current source $I_p$ may be connected between the logic voltage VDDL and source nodes of the first and second input transistors MP1 and MP2. The current source $I_p$ may be controlled by the mode control signal Mode. The LS buffer 131 may be turned on/off according to whether the current source $I_p$ is turned on/off.

The HS buffer 132 of FIG. 13 may distinguish a signal level of data, which is received through the node D_IO, based on the reference voltage $V_{ref}$. For example, when a voltage level of data, which is received through the node D_IO, is higher than a voltage level of the reference voltage $V_{ref}$, the amount of current flowing through the second input transistor MP2 may decrease; in contrast, the amount of current flowing through the first input transistor MP1 may increase. As such, because the amount of current of the first load transistor MN1 increases, a voltage of the output node D_INb may increase. Accordingly, the HS buffer 132 may receive a logical "1" and may output the received logical "1" to the output node D_INb.

In FIG. 13, the differential amplifier is illustrated as an example embodiment of the HS buffer 132. This is only an example. For example, the HS buffer 132 may not be limited to FIG. 13 and may be implemented as any circuit having buffer function. Although not illustrated in FIGS. 12 and 13, each of the LS and HS buffers 131 and 132 may further include a flip-flop for synchronizing the received data with a clock signal.

Figure 14:
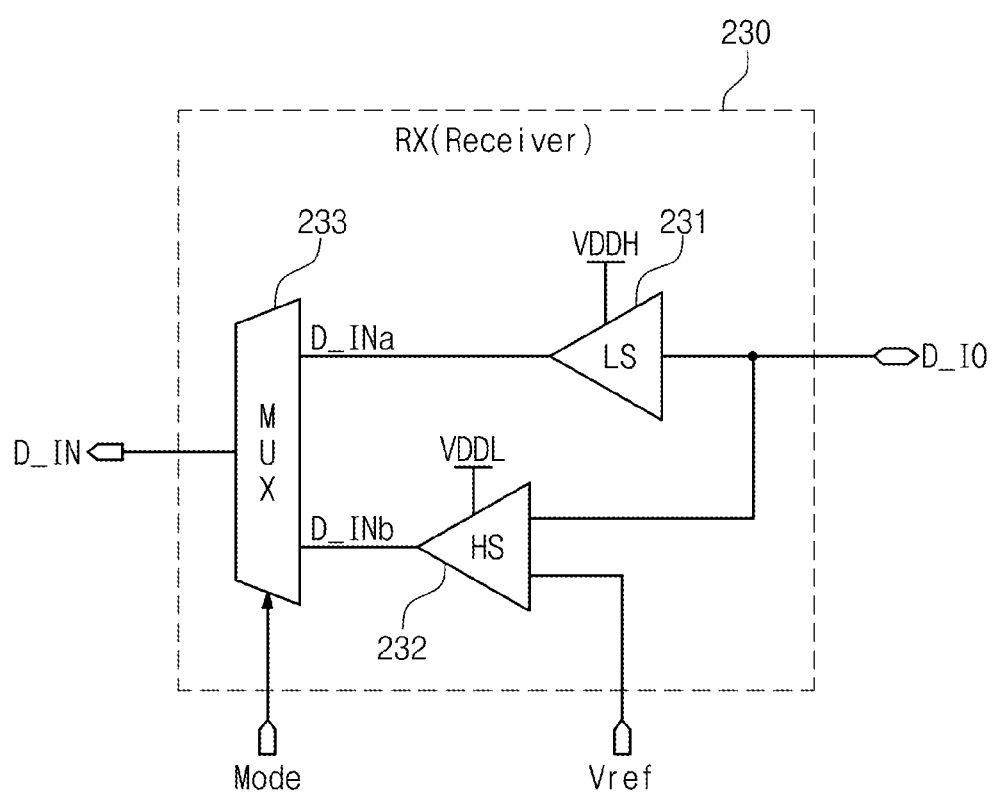
FIG. 14 is a block diagram illustrating another example embodiment of the receiver circuit illustrated in FIG. 1.

FIG. 14 is a block diagram illustrating another example embodiment of the receiver circuit illustrated in FIG. 1. Referring to FIG. 14, a receiver circuit 230 may include an LS buffer 231, a HS buffer 232, and a multiplexer 233. Configurations and operations of the LS buffer 231 and the HS buffer 232 may operate substantially the same as or similar to those of FIG. 11 except that the LS buffer 231 and the HS buffer 232 are not controlled by the mode control signal Mode. Thus, a detailed description thereof will not be repeated here.

The multiplexer 233 may be provided with output data of each of the LS and HS buffers 231 and 232 and may provide output data, which is selected by the mode control signal Mode, to the node D_IN. Although not illustrated in FIG. 14, the multiplexer 233 may further include a function of a level shifter for an output data signal of the HS buffer 232. As the multiplexer 233 receives the mode control signal Mode, the LS and HS buffers 231 and 232 may not be controlled by the mode control signal Mode. Accordingly, compared to the LS and HS buffers 131 and 132 of FIG. 11, the LS and HS buffers 231 and 232 can be designed in an improved manner.

Figure 15:
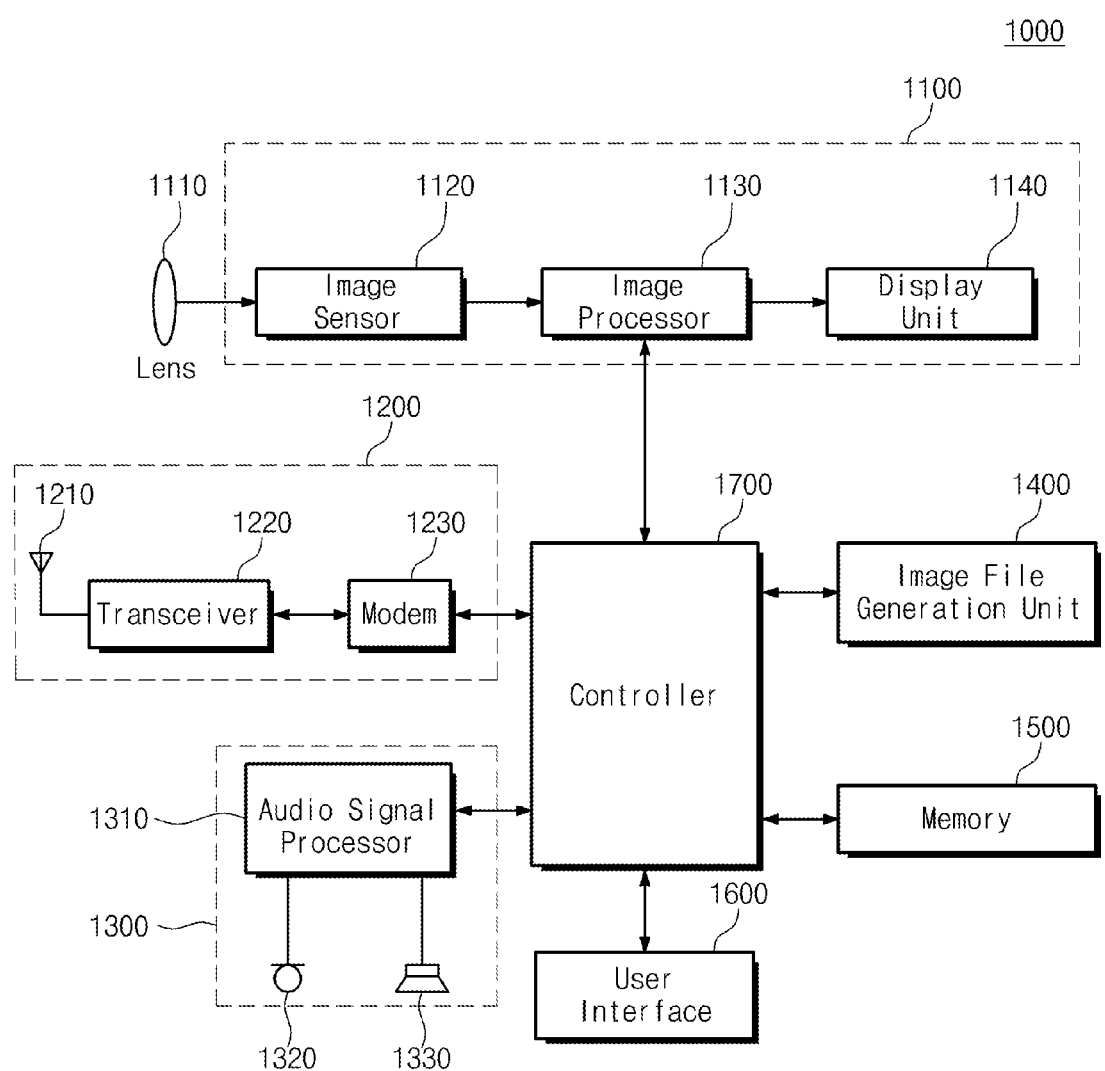
FIG. 15 is a block diagram illustrating a mobile electronic device according to an example embodiment of the inventive concepts.

FIG. 15 is a block diagram illustrating a mobile electronic device according to an example embodiment of the inventive concepts. Referring to FIG. 15, a mobile electronic device 1000 may include a lens 1110, an image processing unit 1100, a wireless transceiver unit 1200, an audio processing unit 1300, an image file generation unit 1400, a memory 1500, a user interface 1600, and a controller 1700.

The image processing unit 1100 may include an image sensor 1120, an image processor 1130, and a display unit 1140. The wireless transceiver unit 1200 may include an antenna 1210, a transceiver 1220, and a modem 1230. The audio processing unit 1300 may include an audio processor 1310, a microphone 1320, and a speaker 1330.

The memory 1500 may be a memory card such as a multimedia card (MMC), an embedded multimedia card (eMMC), a secure digital (SD) card, a micro SD card, etc. Furthermore, the controller 1700 may be a system-on-chip that drives an application program, an operating system, etc. The controller 1700 may be configured to communicate with the image processor 1130 and the modem 1230.

The memory 1500 may be implemented with a memory including the transmitter circuit and the receiver circuit described with reference to FIGS. 1 to 14. In some example embodiments, the controller 1700 may be implemented with a system-on-chip including the transmitter circuit and the receiver circuit described with reference to FIGS. 1 to 14. Accordingly, even when a supply voltage varies according to the DVFS, the memory 1500 or the controller 1700 may efficiently transmit and receive data.

According to an example embodiment, because the transmitter circuit and the receiver circuit operate at a low driving voltage, the power consumption thereof may decrease. In addition, because the receiver circuit has dedicated buffers in accordance with operating voltages, the receiver circuit may be designed to reduce the design area occupied by the receiver circuit, and thus the performance thereof may be improved.

As described above, best example embodiments are disclosed in the drawings and specifications. Here, the terminology used herein is for the purpose of describing particular example embodiments only and is not intended to limit the inventive concepts. Therefore, it will be understood that various modifications and other equivalent example embodiments are possible from this point by those skilled in the art. The technical protection scope of the present inventive concepts will be defined by the technical spirit of the appended claims.

What is claimed is:

1. A transmitter circuit comprising:
a pre-driver circuit configured to receive a logic signal from a logic circuit and to generate a first signal driven by a first voltage, the pre-driver circuit including a transistor having a threshold voltage equal to or lower than a threshold voltage of a transistor included in the logic circuit;
a main-driver circuit configured to receive the first signal and generate a second signal driven by a second voltage, the main-driver circuit configured to output the second signal to an input/output pad, the main-driver circuit including a transistor having a threshold voltage which is equal to or lower than the threshold voltage of the transistor included in the logic circuit;
a level shifter configured to convert a voltage level of the logic signal to a level of the first voltage; and
a multiplexer circuit between the level shifter and the pre-driver circuit, the multiplexer circuit configured to receive the logic signal and the converted logic signal having the first voltage and provide one of the logic signal or the converted logic signal to the pre-driver circuit according to a mode control signal, the mode control signal determined according to a transmission frequency of data transmitted/received to/from the input/output pad.

2. The transmitter circuit of claim 1, wherein the main-driver circuit comprises:
a PMOS transistor configured to pull up a voltage of the input/output pad to the second voltage by the first signal;
a first resistor connected between the PMOS transistor and the input/output pad;
an NMOS transistor configured to pull down the voltage of the input/output pad to a third voltage by the first signal; and
a second resistor connected between the NMOS transistor and the input/output pad.

3. The transmitter circuit of claim 1, wherein the main-driver circuit comprises:
a first NMOS transistor configured to pull up a voltage of the input/output pad to the second voltage by the first signal;
a first resistor connected between the first NMOS transistor and the input/output pad;
an inverter configured to generate an inverted signal by inverting the first signal;
a second NMOS transistor configured to pull down the voltage of the input/output pad to a third voltage by the inverted signal; and
a second resistor connected between the second NMOS transistor and the input/output pad.

4. A transmitter circuit comprising:
a pre-driver circuit configured to receive a logic signal from a logic circuit and generate a first signal driven by a first voltage, the pre-driver circuit including a transistor having a threshold voltage equal to or lower than a threshold voltage of a transistor included in the logic circuit;
a main-driver circuit configured to receive the first signal and generate a second signal driven by a second voltage, the main-driver circuit configured to output the second signal to an input/output pad, the main-driver circuit including a transistor having a threshold voltage which is equal to or lower than the threshold voltage of the transistor included in the logic circuit;
a level shifter configured to convert a voltage level of the first signal to the second voltage; and
a multiplexer circuit between the level shifter and the main-driver circuit, the multiplexer circuit configured to receive the first signal and the converted first signal having the second voltage and provide one of the first signal or the converted first signal to the main-driver circuit according to a mode control signal, the mode control signal determined according to a transmission frequency of data transmitted/received to/from the input/output pad.

5. An interface circuit comprising:
a transmitter including,
   a pre-driver circuit configured to receive a logic signal from a logic circuit and generate a first signal driven by a first voltage, the pre-driver circuit including a transistor having a threshold voltage equal to or lower than a threshold voltage of a transistor included in the logic circuit,
   a main-driver circuit configured to receive the first signal and generate a second signal driven by a second voltage, the main-driver circuit configured to output the second signal to an input/output pad, the main-driver circuit including a transistor having a threshold voltage which is equal to or lower than the threshold voltage of the transistor included in the logic circuit,
   a level shifter configured to convert a voltage level of the logic signal to a level of the first voltage, and
   a multiplexer circuit between the level shifter and the pre-driver circuit, the multiplexer circuit configured to receive the logic signal and the converted logic signal having the first voltage and provide one of the logic signal or the converted logic signal to the pre-driver circuit according to a mode control signal, the mode control signal determined according to a transmission frequency of data transmitted/received to/from the input/output pad; and
a receiver including,
   a first input buffer configured to be driven by the first voltage to receive input data of a low-frequency band from the input/output pad, and
   a second input buffer configured to be driven by a third voltage to receive input data of a high-frequency band from the input/output pad.

6. The interface circuit of claim 5, wherein the first voltage and the second voltage have a same voltage level.

7. The interface circuit of claim 5, wherein a level of the third voltage is a same as a high level of the logic signal.

8. The transmitter circuit of claim 4, wherein the main-driver circuit comprises:
   a PMOS transistor configured to pull up a voltage of the input/output pad to the second voltage by the first signal;
   a first resistor connected between the PMOS transistor and the input/output pad;
   an NMOS transistor configured to pull down the voltage of the input/output pad to a third voltage by the first signal; and
   a second resistor connected between the NMOS transistor and the input/output pad.

9. The transmitter circuit of claim 4, wherein the main-driver circuit comprises:
   a first NMOS transistor configured to pull up a voltage of the input/output pad to the second voltage by the first signal;
   a first resistor connected between the first NMOS transistor and the input/output pad;
   an inverter configured to generate an inverted signal by inverting the first signal;
   a second NMOS transistor configured to pull down the voltage of the input/output pad to a third voltage by the inverted signal; and
   a second resistor connected between the second NMOS transistor and the input/output pad.

* * * * *